(12) United States Patent
Hua et al.

(10) Patent No.: US 10,615,375 B2
(45) Date of Patent: Apr. 7, 2020

(54) ORGANIC LIGHT-EMITTING DISPLAY PANEL, ELECTRONIC DEVICE AND METHOD FOR MANUFACTURING THE SAME

(71) Applicants: SHANGHAI TIANMA AM-OLED CO., LTD., Shanghai (CN); TIANMA MICRO-ELECTRONICS CO., LTD., Shenzhen (CN)

(72) Inventors: Wanming Hua, Shanghai (CN); Xiangcheng Wang, Shanghai (CN); Hongyang Ren, Shanghai (CN); Yuji Hamada, Shanghai (CN); Wei He, Shanghai (CN); Jinghua Niu, Shanghai (CN); Chen Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/613,044

(22) Filed: Jun. 2, 2017

(65) Prior Publication Data

US 2017/0271624 A1    Sep. 21, 2017

(30) Foreign Application Priority Data

Nov. 30, 2016    (CN) .......................... 2016 1 1080640

(51) Int. Cl.
*H01L 51/52*    (2006.01)
*H01L 27/32*    (2006.01)
*H01L 51/56*    (2006.01)

(52) U.S. Cl.
CPC ...... *H01L 51/5275* (2013.01); *H01L 27/3211* (2013.01); *H01L 2251/303* (2013.01); *H01L 2251/558* (2013.01)

(58) Field of Classification Search
None
See application file for complete search history.

(56) References Cited

U.S. PATENT DOCUMENTS

2002/0047970 A1* 4/2002 Ono ................. G02F 1/133555
349/122
2009/0103304 A1* 4/2009 Kobayashi .......... H01L 51/5281
362/293

(Continued)

FOREIGN PATENT DOCUMENTS

CN    103178084 A    6/2013
CN    104380842 A    2/2015

*Primary Examiner* — Walter H Swanson
*Assistant Examiner* — Kien C Ly
(74) *Attorney, Agent, or Firm* — Alston & Bird LLP

(57) ABSTRACT

The invention discloses an organic light-emitting display panel, an electronic device and a method for manufacturing the same. The organic light-emitting display panel includes: pixel regions on a substrate which emit light of various colors; each pixel region includes a first electrode, a light-emitting functional layer and a second electrode, one of the first electrode and the second electrode is light exit side electrode(s); an optical coupling layer is set on one side of the light exit side electrode far from the light-emitting functional layer; the refractive index of the optical coupling layer in the blue light wavelength region is 2 to 2.3; the difference between the refractive index of the optical coupling layer in the blue light wavelength region and that in the green light wavelength region is less than or equal to 0.2.

15 Claims, 8 Drawing Sheets

(56) References Cited

U.S. PATENT DOCUMENTS

| | | | |
|---|---|---|---|
| 2012/0138918 A1 | 6/2012 | Naraoka et al. | |
| 2014/0138660 A1* | 5/2014 | Kugler | H01L 51/5088 |
| | | | 257/40 |
| 2014/0203271 A1* | 7/2014 | Yoneda | H01L 51/5265 |
| | | | 257/40 |
| 2017/0352842 A1* | 12/2017 | Shiratori | H01L 51/5275 |
| 2018/0019429 A1* | 1/2018 | Park | F21S 43/145 |

* cited by examiner

ORGANIC LIGHT-EMITTING DISPLAY PANEL, ELECTRONIC DEVICE AND METHOD FOR MANUFACTURING THE SAME

CROSS-REFERENCE TO RELATED APPLICATIONS

This application claims priority to Chinese Patent Application No. CN201611080640.3, filed on Nov. 30, 2016 and entitled "ORGANIC LIGHT-EMITTING DISPLAY PANEL, ELECTRONIC DEVICE AND METHOD FOR MANUFACTURING THE SAME", the disclosure of which is incorporated herein by reference in its entirety.

TECHNICAL FIELD

Embodiments of the present invention relate to organic light-emitting display technologies, and in particular, to an organic light-emitting display panel, an electronic device and a method for manufacturing the same.

BACKGROUND

An Organic Light-Emitting Diode (i.e., OLED) is also referred to as an organic electroluminescent device, which has a basic structure thereof includes an anode, a cathode and a light-emitting layer that correspond to each pixel region. When a voltage is applied to the anode and the cathode, holes move to a light-emitting layer via a hole transport layer, and electrons move to the light-emitting layer via an electron transport layer, then the holes and the electrons are recombined in the light-emitting layer, and the excitons in the materials of the light-emitting layer transit from an excited state to a ground state so that light is emitted out.

When the light passes through the cathode, the electrons in the cathode that may move freely will interact with the photons, so as to generate an electron dilatational wave that propagates along the surface of the cathode metal, which is called a surface plasmon polariton. Thus, the light will lose a part of its energy when passing through the cathode metal layer. Therefore, at present, an optical coupling layer (CPL) is generally manufactured above the cathode, so that the generation of the surface plasmon polaritons will be suppressed, the loss of the light passing through the cathode metal layer will be reduced, thereby improving the light extraction efficiency. Also, the optical coupling layer with a high refractive index may also reduce the total reflection from the cathode and coupling layer interface on the light exit side, lower the optical waveguide effect in the device, thereby further improving the light extraction efficiency. However, for the light of different colors, the corresponding optimal thicknesses of the optical coupling layers are different, and the longer the wavelength is, the larger the corresponding optimal thickness of the optical coupling layer will be. Therefore, different thicknesses of the optical coupling layer needs to be provided for the pixel regions that emit light with different colors, and hence the manufacture cost of the organic light-emitting display panel will be increased.

SUMMARY

The present invention provides an organic light-emitting display panel, an electronic device and a method for manufacturing the same, thereby lowering the cost of the organic light-emitting display panel.

In a first aspect, embodiments of the application provide an organic light-emitting display panel, which includes pixel regions emitting light of various different colors that are formed on a substrate; each of the pixel regions includes a first electrode, a light-emitting functional layer and a second electrode that are set in a direction departing from the substrate;

the first electrode and/or the second electrode are/is light exit side electrode(s) of the organic light-emitting display panel; and an optical coupling layer is set on one side of the light exit side electrode that is far from the light-emitting functional layer;

the refractive index of the optical coupling layer in the blue light wavelength region is in a range of 2 to 2.3;

the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1.

In a second aspect, embodiments of the present invention further provide an electronic device, which includes the organic light-emitting display panel according to the first aspect.

In a third aspect, embodiments of the present invention further provide a method for manufacturing an organic light-emitting display panel, which includes:

forming an optical coupling layer on a substrate that includes pixel regions emitting light of various different colors;

forming a first electrode on the optical coupling layer;

forming a light-emitting functional layer on the first electrode; and forming a second electrode on the light-emitting functional layer;

wherein, the second electrode is a light exit side electrode of the organic light-emitting display panel; the refractive index of the optical coupling layer in the blue light wavelength region is in a range of 2 to 2.3;

the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1.

In the embodiments of the present invention, an optical coupling layer is disposed on one side of the light exit side electrode that is away from the light-emitting functional layer, and the refractive index of the optical coupling layer in the blue light wavelength region is set in a range of 2 to 2.3; the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1. The present invention employs an optical coupling layer that has a high refractive index and has a small refractive index difference between the blue, green and red band regions, so that the light extraction efficiency of each band may be improved greatly in the case that the same thickness of optical coupling layer is employed, and it does not need to make different thicknesses of the optical coupling layer respectively for the pixel regions that emit light of different colors. Therefore, the production cost may be lowered, and the yield may be improved.

DETAILED DESCRIPTION

The present invention will be further illustrated in detail in conjunction with the drawings and embodiments. It may be understood that, the specific embodiments described here are only set for explaining, rather than needs to be noted that, for convenient description, the drawings only show the parts related to the disclosure, rather than the whole structure.

Figure 1:
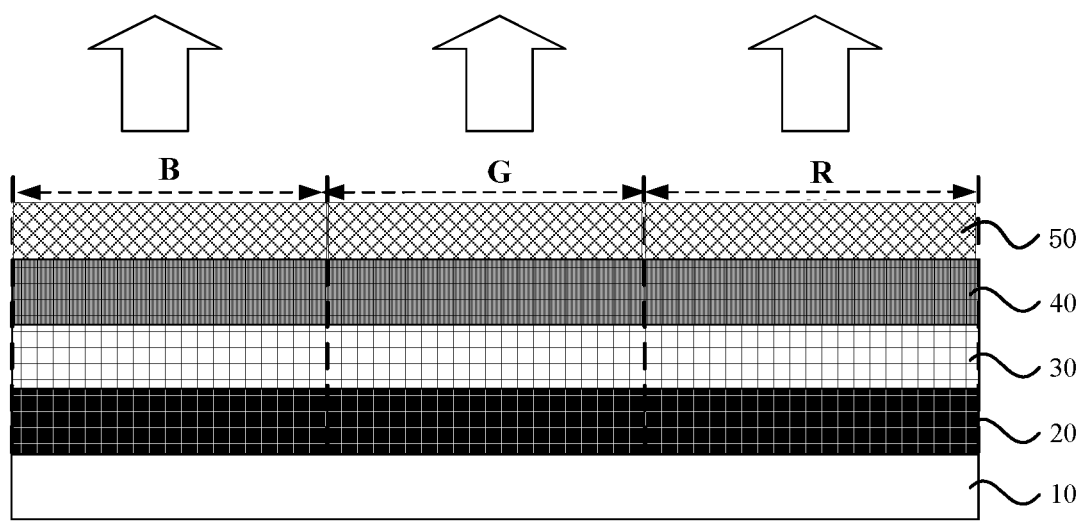
FIG. 1 is a schematic diagram showing the sectional structure of an organic light-emitting display panel according to one embodiment of the present invention.

FIG. 1 is a schematic diagram showing the cross sectional structure of an organic light-emitting display panel according to one embodiment of the present invention. As shown in FIG. 1, the organic light-emitting display panel includes pixel regions emitting light of various different colors which are formed on a substrate, where each pixel region includes a first electrode 20, a light-emitting functional layer 30 and a second electrode 40 that are provided in a direction departing from the substrate 10. In FIG. 1, exemplarily, a pixel region R that emits red light, a pixel region G that emits green light and a pixel region B that emits blue light are provided. The organic light-emitting display panel according to the embodiment of the present invention may be a top emission device, a bottom emission device or a dual-side emission device, that is, the first electrode 20 and/or the second electrode 40 may be provided as the light exit side electrode of the organic light-emitting display panel. In FIG. 1, exemplarily, the second electrode is selected as the light exit side electrode of the organic light-emitting display panel, and the arrow direction in FIG. 1 represents the light exit direction.

In order to improve the light extraction efficiency of the organic light-emitting display panel, in this embodiment, an optical coupling layer (CPL) 50 is provided on one side of the light exit side electrode, i.e., the second electrode 40, which is far from the light-emitting functional layer 30. Generally, the refractive index of the optical coupling layer 50 larger than the refractive index of the light exit side electrode, and in this embodiment, the refractive index of the optical coupling layer 50 in the blue light wavelength region is set in a range of 2 to 2.3. By the fitting of the refractive indexes between the light exit side electrode, i.e., the second electrode 40, and the optical coupling layer 50, on one hand, the total reflection loss of the light on the interface of the light exit side electrode, i.e., the second electrode 40, may be lower; and on the other hand, the optical coupling layer 50 may also suppress the energy loss of the light on the surface of the light exit side electrode, i.e., the second electrode 40, due to the surface plasmon polaritons, so that the light extraction efficiency of the organic light-emitting display panel may be improved.

Because the wavelengths of the light of different colors are different, the refractive index of the corresponding optical coupling layer 50 will be different, and the thickness of the optical coupling layer 50 required to obtain the optimal light extraction efficiency will be different. The longer the wavelength is, the thicker the optical coupling layer 50 will be required. However, the setting of optical coupling layers 50 with different thicknesses respectively for the pixel regions that emit light of different colors will undoubtedly complicate the manufacture process, and also the yield will be influenced. Therefore, in order to lower the production cost and increase the light extraction efficiency of light of different colors, for example, the three primary colors of red, green and blue, to the large extent, the thickness of the optical coupling layer 50 corresponding to the pixel region that emits blue light is generally employed as the thickness of the optical coupling layer 50 corresponding to all the pixel regions that emit light.

In the above embodiment of the present invention, in order to lower the loss of the light extraction efficiency of the pixel regions that emit red light and green light, the refractive index of the optical coupling layer 50 in the blue light wavelength region is set in a range of 2 to 2.3; the difference between the refractive index of the optical coupling layer 50 in the blue light wavelength region and the refractive index of the optical coupling layer 50 in the green light wavelength region is less than or equal to 0.2; and the difference between the refractive index of the optical coupling layer 50 in the green light wavelength region and the refractive index of the optical coupling layer 50 in the red light wavelength region is less than or equal to 0.1. Optionally, it may also set that the refractive index of the optical coupling layer 50 in the green light wavelength region is greater than or equal to 1.8, and the refractive index in the red light wavelength region is greater than or equal to 1.7.

Figure 2:
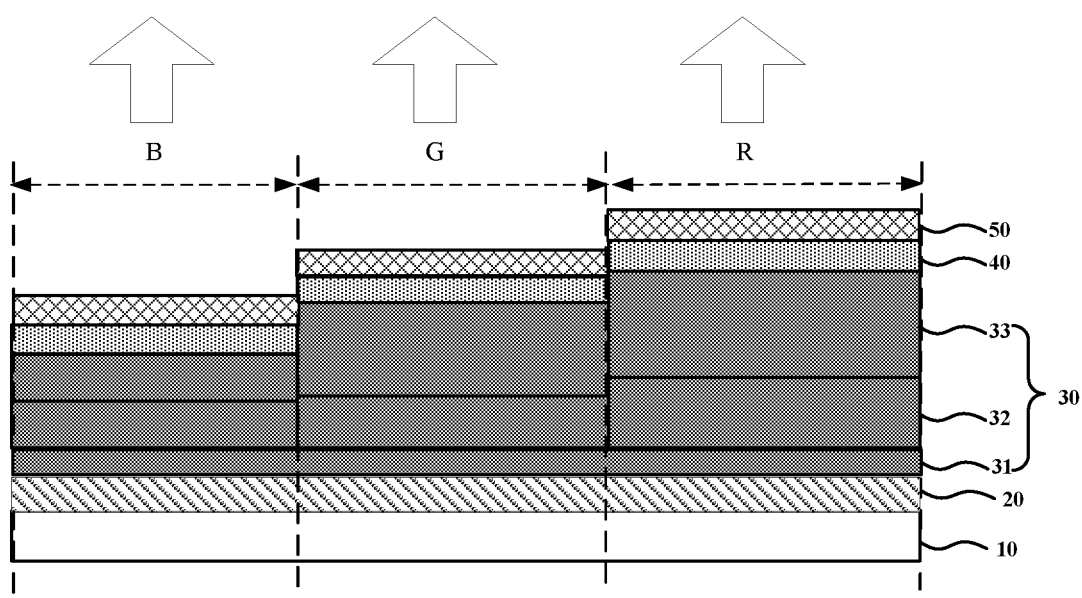
FIG. 2 is a schematic diagram showing the sectional structure of another organic light-emitting display panel according to one embodiment of the present invention.

FIG. 2 is a schematic diagram showing the cross sectional structure of another organic light-emitting display panel according to one embodiment of the present invention. Different from FIG. 1, the light-emitting functional layer 30 of the organic light-emitting display panel may include a first auxiliary functional layer 31, a light-emitting material layer 32 and a second auxiliary functional layer 33. The first auxiliary functional layer 31, the light-emitting material layer 32 and the second auxiliary functional layer 33 of the organic light-emitting display panel may be formed via evaporation. The first auxiliary functional layer 31 is consisted of a hole-type auxiliary light-emitting material, and may have a multi-layer structure, which for example may include a hole injection layer, a hole transport layer and an electron blocking layer. The second auxiliary functional layer 33 is consisted of an electron-type auxiliary light-emitting material, and may also have a multi-layer structure, which may include an electron transport layer, an electron injection layer and a hole blocking layer.

In the structure of the organic light-emitting display panel, the luminescent feature may be adjusted by introducing an optical micro-resonant cavity (micro-cavity structure, for short). The micro-cavity structure is formed of a multilayer film between the two electrodes of the organic light-emitting display panel, and the light can be restricted within a very small wavelength region from the effects of reflection, total reflection, interference, diffraction or scattering, etc., of light on the interfaces with discontinuous refractive indexes. By designing appropriate cavity length and optimizing the thickness of each layer in the cavity, the luminescence center can be made in the vicinity of the antinode of the stationary field in the cavity, and the coupling efficiency of the radiating doublet of the device and the electric field in the cavity may be improved, so that the light-emitting efficiency and the lightness of the device may be improved. The cavity length of the micro-cavity structure corresponding to the pixel region is positively correlated to the wavelength of the corresponding light color. The cavity length of the micro-cavity structure may be adjusted by the first auxiliary functional layer 31, the light-emitting material layer 32 and the second auxiliary functional layer 33. In FIG. 2, exemplarily, the cavity length of the micro-cavity structure is adjusted by the second auxiliary functional layer 33.

In FIG. 2, the thickness of the second auxiliary functional layer 33 corresponding to the pixel region R that emits red light is provided larger than the thickness of the second auxiliary functional layer 33 corresponding to the pixel region G that emits green light; and the thickness of the second auxiliary functional layer 33 corresponding to the pixel region G that emits green light is set larger than the thickness of the second auxiliary functional layer 33 corresponding to the pixel region B that emits blue light. It should be understood by one skilled in the art that, in some implementations, by the fitting of the refractive indexes between the optical coupling layer and the light exit side electrode, it may further strengthen the light intensity reinforcement effect of the micro-cavity structure and improve the light extraction efficiency.

Next, referring to Table 1, which is a comparison table showing the measurement results when various optical coupling layers are employed in the OLED device according to the above embodiments. The external quantum efficiency of each device is measured under a current density of 10 mA/cm$^2$. The thicknesses of the optical coupling layers A, B, C and D in thr tests all employ the optimal thickness corresponding to the blue light wavelength region. It should be noted that, the molecular formula of the material employed by the optical coupling layer A is

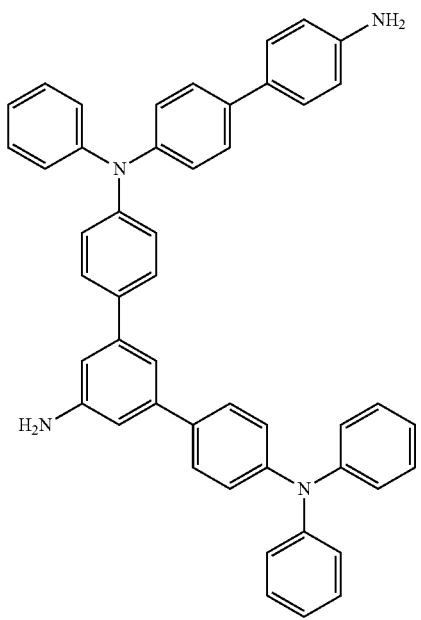

the molecular formula of the material employed by C is

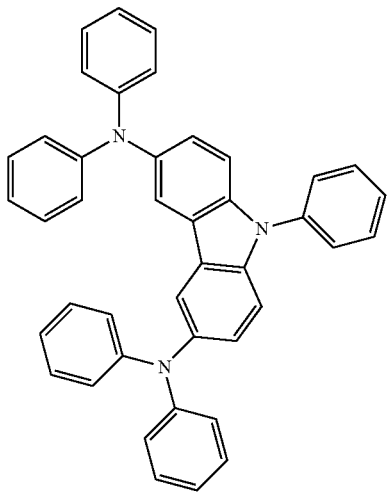

the molecular formula of the material employed by D is

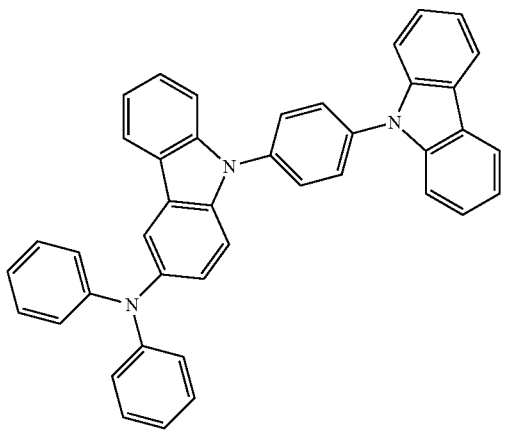

and the material used by the optical coupling layer B is MoOx.

Figure 4:
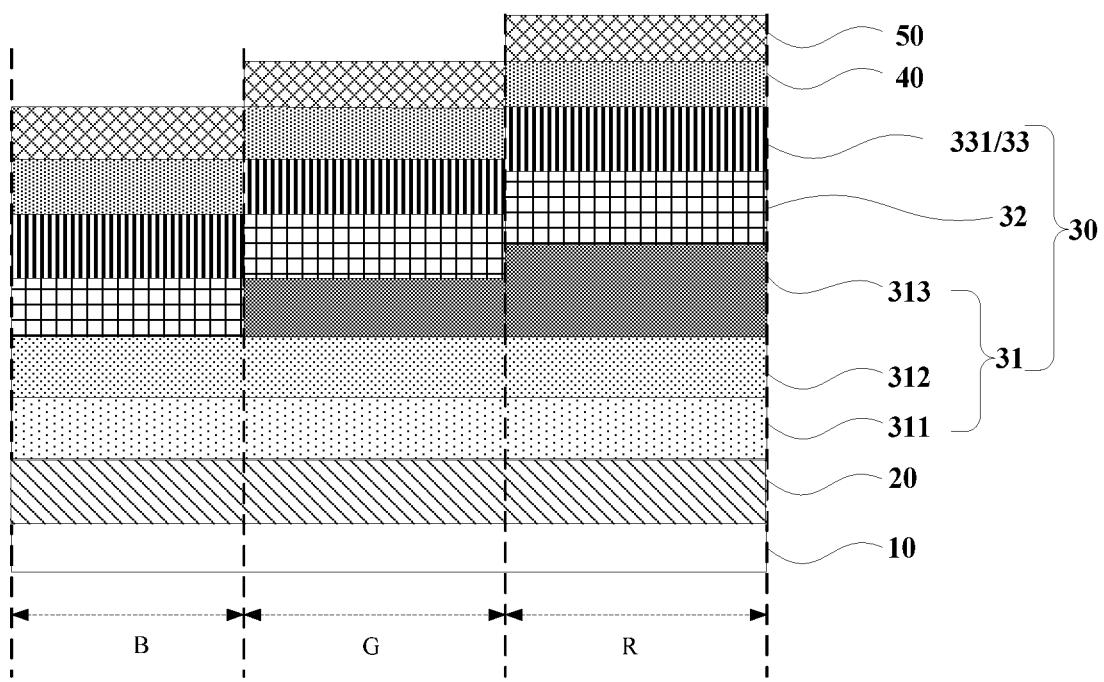
FIG. 4 is a schematic diagram showing the sectional structure of another organic light-emitting display panel according to one embodiment of the present invention.

For the specific structure of the OLED device in each of the above embodiments, reference may be made to FIG. 4. The OLED structure is formed in pixel regions on a substrate, the structure emits light of various colors: a pixel region R that emits red light, a pixel region G that emits green light and a pixel region B that emits blue light. Each pixel region includes a first electrode 20, a light-emitting functional layer 30 and a second electrode 40 that are stacked up over the substrate 10. An optical coupling layer 50 is set on one side of the light exit side electrode, i.e., the second electrode 40 that is away from the light-emitting functional layer 30. The light-emitting functional layer 30 includes a first auxiliary functional layer 31, a light-emitting material layer 32 and a second auxiliary functional layer 33. The first auxiliary functional layer 31 includes a hole injection layer 311 and a hole transport layer 312. The second auxiliary functional layer 33 includes an electron transport layer 331. The effective cavity length of the micro-cavity structure is adjusted by the hole transport layer of the first auxiliary functional layer 31, and in this embodiment, the hole transport layer that adjusts the effective cavity length of the micro-cavity structure is a hole transport auxiliary layer 313.

In FIG. 4, a hole transport auxiliary layer 313 is disposed on the hole transport layer 312 of the pixel region R that emits red light and the pixel region G that emits green light, and the thickness of the hole transport auxiliary layer 313 corresponding to the pixel region R that emits red light is larger than the thickness of the hole transport auxiliary layer 313 corresponding to the pixel region G that emits green light. The first electrode 20 employs Ag, with a thickness of about 600 Å. The thickness of the hole injection layer 311 is about 900 Å, and the hole injection layer 311 is formed of (4,4',4"[3-methylphenyl(phenyl)-amino] triphenylamine) (m-MTDATA). The thickness of the hole transport layer 312 is 200 Å, and the hole transport layer 312 is formed of (N,N'-diphenyl-N,N'-bis(3-methylphenyl)-1,1'-biphenyl-4,4'-diamine) (TPD). The thickness of the hole transport auxiliary layer 313 corresponding to the pixel region G that emits green light is about 300 Å. The thickness of the hole transport auxiliary layer 313 corresponding to the pixel region R that emits red light is about 1000 Å. The hole transport auxiliary layer 313 and the hole transport layer 312 employ the same material. The thickness of the light-emitting material layer 32 is about 300 Å, and the light-emitting material layer 32 employs a host-dopant system. The doping volume ratio of the host material and the guest dopant material in each color light-emitting material layer is between 1% to 10%. In FIG. 4, the host-dopant material of the pixel region R that emits red light is diphenyl ethylene (CBP), and the guest dopant material is tris (1-phenylquinolyl) iridium (PQIr). The host dopant material of the pixel region G that emits green light is diphenyl ethylene (CBP) and 1,3-bis (carbazol-9-yl) benzene (mCP), and the guest dopant material is tris (2-phenylpyridine) iridium (Ir(ppy)$_3$). The host dopant material of the pixel region B that emits blue light is diphenyl ethylene (CBP), and the guest dopant material is FIrpic. The thickness of the electron transport layer 331 is about 300 Å, and the electron transport layer 331 is formed of 8-hydroxyquinoline aluminum (Alq3). The thickness of the second electrode 40 is about 200 Å, and is formed of Mg:Ag alloy, with a volume ratio of Mg to Ag of 1:10. The thickness of the optical coupling layer 50 is in a range of about 500 Å to about 800 Å.

It may be known from Table 1 that, the refractive index of the optical coupling layer A corresponding to the blue light wavelength region is 2.40; the refractive index of the optical coupling layer A corresponding to the green light wavelength region is 2.31; and the refractive index of the optical coupling layer A corresponding to the red light wavelength region is 2.26. The refractive index of the optical coupling layer B corresponding to the blue light wavelength region is 2.22; the refractive index of the optical coupling layer B corresponding to the corresponding green light wavelength region is 2.17; and the refractive index of the optical coupling layer B corresponding to the red light wavelength region is 2.08. The refractive index of the optical coupling layer C corresponding to the blue light wavelength region is 2.2; the refractive index of the optical coupling layer C corresponding to the green light wavelength region is 1.9; and the refractive index of the optical coupling layer C corresponding to the red light wavelength region is 1.7. The refractive index of the optical coupling layer D corresponding to the blue light wavelength region is 1.86; the refractive index of the optical coupling layer D corresponding to the green light wavelength region is 1.73; and the refractive index of the optical coupling layer D corresponding to the red light wavelength region is 1.68. Additionally, in the embodiments of the present invention, the external quantum efficiency and the color cast after optical coupling layers of different materials are applied to an OLED are also measured.

TABLE 1

Comparison Table of Refractive Indexes versus Wavelengths Of Optical Coupling Layers having Different Materials

| Material | Color | | Refractive Index | External quantum efficiency (%) | Color Cast |
|---|---|---|---|---|---|
| A | Blue | 460 nm | 2.40 | 14.50 | 0.067 |
|  | Green | 520 nm | 2.31 | 34.50 | 0.020 |
|  | Red | 610 nm | 2.26 | 31.00 | 0.018 |
| B | Blue | 460 nm | 2.22 | 13.20 | 0.018 |
|  | Green | 520 nm | 2.17 | 32.30 | 0.015 |
|  | Red | 610 nm | 2.08 | 29.30 | 0.017 |
| C | Blue | 460 nm | 2.20 | 13.10 | 0.018 |
|  | Green | 520 nm | 1.90 | 29.20 | 0.010 |
|  | Red | 610 nm | 1.70 | 26.30 | 0.080 |
| D | Blue | 460 nm | 1.86 | 11.80 | 0.007 |
|  | Green | 520 nm | 1.73 | 25.00 | 0.005 |
|  | Red | 610 nm | 1.68 | 26.20 | 0.008 |

Referring to Table 1, the difference between the refractive index of the optical coupling layer A in the blue light wavelength region and the refractive index of the optical coupling layer A in the green light wavelength region is 0.09, and the difference between the refractive index of the optical coupling layer A in the green light wavelength region and the refractive index of the optical coupling layer A in the red light wavelength region is 0.05. It may be seen that the refractive index difference between the optical coupling layers corresponding to different color wavelength regions is small, so that the external quantum efficiency of the OLED device in different color wavelength regions is kept at a high value, for example, in Table 1, the external quantum efficiency of the blue light wavelength region is 14.5%, the external quantum efficiency of the green light wavelength region is 34.5%, and the external quantum efficiency of the red light wavelength region is 31.0%. However, the higher the refractive index is, the more serious the color cast will be caused, and because the refractive index of the optical coupling layer A in the blue light wavelength region reached 2.4, the color cast in the blue light wavelength region is more severe. In a common display, the standard of color cast requirement is 0.02, but as shown in Table 1, the color cast of the optical coupling layer A in the blue light wavelength region has reached 0.067.

Still referring to Table 1, the refractive index of the optical coupling layer C in the blue light wavelength region is 2.2, and after being applied to an OLED device, it is measured that the color cast in the blue light wavelength region, the green light wavelength region and the red light wavelength region is all kept at about 0.01, which can meet the normal display requirements of a display device. However, because the difference between the refractive index of the optical coupling layer C in the blue light wavelength region and the refractive index of the optical coupling layer C in the green light wavelength region is 0.3, and the difference between the refractive index of the optical coupling layer C in the green light wavelength region and the refractive index of the optical coupling layer C in the red light wavelength region is 0.2, the refractive index difference between the optical coupling layers corresponding to different color wavelength regions will be too large, so that the corresponding external quantum efficiency of the OLED device will be lowered. As shown in Table 1, in an OLED that employs the optical coupling layer C, the external quantum efficiency of the corresponding blue light wavelength region of is 13.1%, the external quantum efficiency of the corresponding green light wavelength region is 29.2%, and the external quantum efficiency of the corresponding red light wavelength region is 26.3%.

The difference between the refractive index of the optical coupling layer D in the blue light wavelength region and the refractive index of the optical coupling layer D in the green light wavelength region is 0.13, the difference between the refractive index of the optical coupling layer D in the green light wavelength region and the refractive index of the optical coupling layer D in the red light wavelength region is 0.05, and the refractive index of the optical coupling layer D in the blue light wavelength region, the green light wavelength region and the red light wavelength region is all small. The color cast in different color wavelength regions is small, and the refractive index difference between the optical coupling layers corresponding to different color wavelength regions is small. However, because the refractive indexes of the optical coupling layer D in the blue light wavelength region, the green light wavelength region and the red light wavelength region are all comparatively small, the light emitted by the light-emitting layer cannot be effectively extracted, and hence the overall efficiency of the OLED device will be lowered. As shown in Table 1, In an OLED that employs the optical coupling layer D, the external quantum efficiency of the corresponding blue light wavelength region of is 11.8%, the external quantum efficiency of the corresponding green light wavelength region is 25.0%, and the external quantum efficiency of the corresponding red light wavelength region is 26.2%.

The difference between the refractive index of the optical coupling layer B in the blue light wavelength region and the refractive index of the optical coupling layer B in the green light wavelength region is 0.05, and the difference between the refractive index of the optical coupling layer B in the green light wavelength region and the refractive index of the optical coupling layer B in the red light wavelength region is 0.09. It may be seen that the refractive index difference is sufficiently small, and in the case that the same thickness of optical coupling layer is employed, the light extraction efficiency of each band may be improved greatly. Additionally, the refractive index of the optical coupling layer B in the blue light wavelength region is 2.26, the refractive index in the green light wavelength region is 2.22, and the refractive index in the red light wavelength region is 2.02, so that the total reflection on the interface between the light exit side electrode and the optical coupling layer can be reduced effectively. Moreover, the refractive index of the optical coupling layer B in the blue light wavelength region is less than 2.3, and thus no too large color cast would be caused. As shown in Table 1, the external quantum efficiency of the corresponding blue light wavelength region of an OLED that employs the optical coupling layer B is 13.2%, the external quantum efficiency of the corresponding green light wavelength region is 32.3%, and the external quantum efficiency of the corresponding red light wavelength region is 29.3%. The color cast of the optical coupling layer A in the blue light wavelength region is 0.018, the color cast in the green light wavelength region is 0.015, and the color cast in the red light wavelength region is 0.017. Such a test result indicates that, the optical coupling layer B can realize the effect of both improving the external quantum efficiency of an OLED device and reducing the color cast.

Based on the above embodiments, in some embodiments of the present invention, the extinction coefficient of the optical coupling layer in the blue light wavelength region may be less than or equal to 0.1, the extinction coefficient in the green light wavelength region may be less than or equal to 0.01, and the extinction coefficient in the red light wavelength region may be less than or equal to 0.01, and thus the optical loss of the light of different colors in the optical coupling layer 50 may be further reduced, and the light extraction efficiency may be improved.

Figure 3:
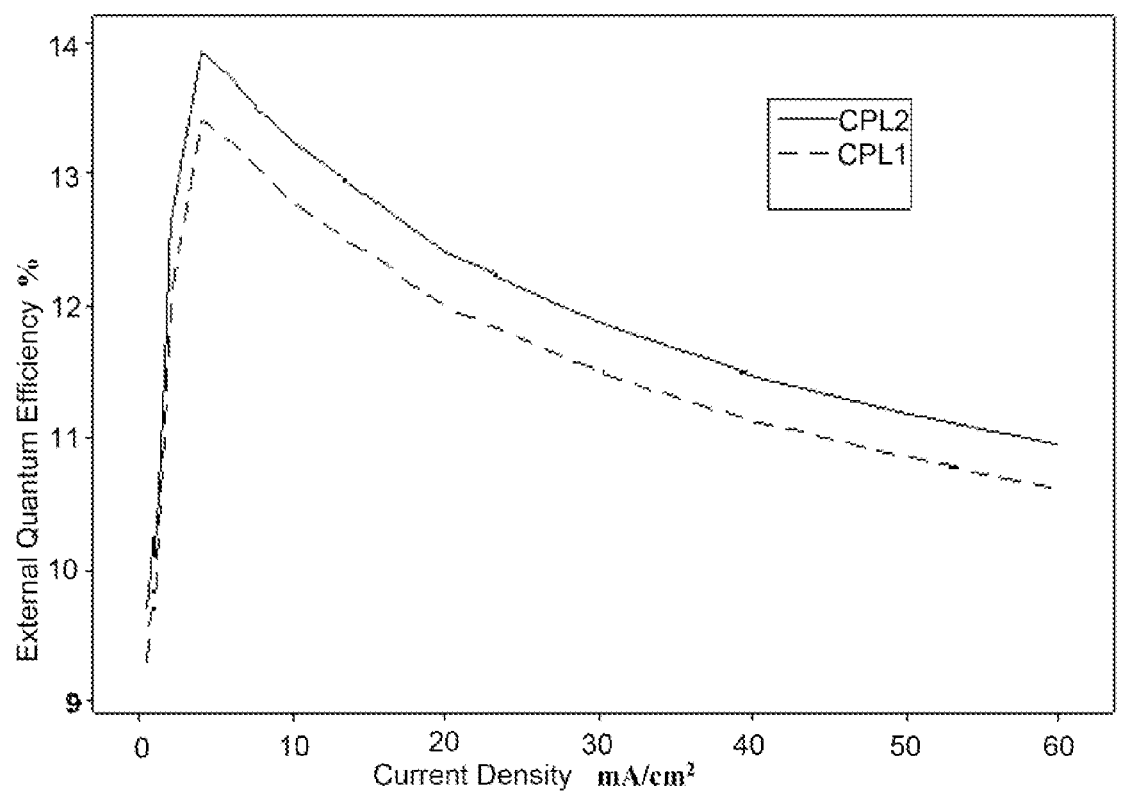
FIG. 3 is a comparison diagram of the external quantum efficiency of the device according to one embodiment of the present invention to that of the prior art.

Next, referring to FIG. 3, it is a comparison diagram of the external quantum efficiency of the device according to one embodiment of the present invention to that of the prior art. The embodiment of the present invention shown in FIG. 3 and the prior art both employs the OLED device structure as shown in FIG. 4, and the thicknesses of the corresponding same film layers in the embodiment of the present invention and the prior art are also the similar. It should be noted that, in FIG. 3, the refractive index of the optical coupling layer CPL1 employed in the prior art in the blue light wavelength region is 1.9, the refractive index of the optical coupling layer CPL1 in the green light wavelength region is 1.82, and the refractive index of the optical coupling layer CPL1 in the red light wavelength region is 1.75. The optical coupling layer CPL2 used in the embodiment of the present application employs the optical coupling layer B according to the above embodiments of the present application; that is, in FIG. 3, the optical coupling layer CPL2 used in the embodiment of the present application is composed of MoOx. It may be seen from FIG. 3 that, under different current densities, the external quantum efficiency of the OLED according to the embodiment of the present invention that employs the optical coupling layer CPL2 is always larger than the external quantum efficiency of the OLED of the prior art that employs the optical coupling layer CPL1.

Optionally, the light-emitting material layer 32 includes a host dopant material and a guest dopant material. The light-emitting material layer 33 corresponding to the pixel region R that emits red light and/or the light-emitting material layer 33 corresponding to the pixel region B that emits blue light may employ one or two host materials; the light-emitting material layer 33 corresponding to the pixel region G that emits green light may employ at least two host materials. It should be understood by one skilled in the art that, the content of the host material in the light-emitting material layer 33 is larger than that of the light-emitting guest material. Generally, the absolute HOMO energy level of the host material |T_host (HOMO)| is larger than the absolute HOMO energy level of the guest dopant material |T_dopant (HOMO)|, the absolute LUMO energy level of the host material |T_host (LUMO)| is less than the absolute LUMO energy level of the guest dopant material |T_dopant (LUMO)|, and the triplet state energy level of the host material T_host (S) is larger than the triplet state energy level of the guest material T_dopant (S). The triplet state exciton energy of the host material may be effectively transferred to the light-emitting guest material, and the emission spectrum of the host material and the absorption spectrum of the guest dopant material can match each other in energy.

Additionally, it is noted that, the light-emitting material may include a phosphorescent or fluorescent material as the guest dopant material, for example, the guest dopant material of the light-emitting material layer 33 corresponding to the pixel region R that emits red light and the light-emitting material layer 33 corresponding to the pixel region G that emits green light may be a phosphorescent material, and the guest dopant material of the light-emitting material layer 33 corresponding to the pixel region B that emits blue light may be a fluorescent material. In the invention, the material of the light-emitting material layer is not limited, for example, a non host-dopant doped system material may also be employed, or a light-emitting material with a Thermally Activated Delayed Fluorescence (TADF) function may be employed.

Optionally, after being stacked, the transmittance of the light exit side electrode (for example, the second electrode 40 shown in FIG. 1) and the optical coupling layer 50 in the visible band is greater than or equal to 60%. By the fitting of the refractive indexes of the optical coupling layer 50 and the second electrode 40, the light intensity reinforcement effect of the micro-cavity structure may be strengthened, and the light extraction efficiency may be improved.

Optionally, the optical coupling layer 50 may employ an organic material, or it may employ an inorganic material. For example, it may include MoOx; however, this not limited in the present application. The thickness of the optical coupling layer 50 is in a range of 20 to 140 nm, for example, in one implementation mode of the present invention, the thickness of the optical coupling layer is 50 nm. It should be noted that, the thickness of the optical coupling layer 50 may be appropriately adjusted according to the type of the light-emitting material used in the organic light-emitting display panel and the thickness of the organic light-emitting display panel devices other than the optical coupling layer 50, etc.

Optionally, the optical coupling layer 50 may also have a multilayer stacked structure, that is, the optical coupling layer 50 may include at least one organic layer. The refractive index of the organic layer adjacent to the light exit side electrode is less than or equal to the refractive index of the organic layer far from the light exit side electrode. By the stacked design of the optical coupling layer 50 and the fitting of the refractive index, the light extraction efficiency may be improved.

It should be noted that, the organic light-emitting display panel according to each of the above embodiments may be an active organic light-emitting display panel or an passive organic light-emitting display panel. For the active organic light-emitting display panel, for example, when the second electrode is a light exit side electrode, the first electrode corresponding to each pixel region is electrically insulated from each other, and each pixel region corresponds to one Thin-film transistor (TFT), which is electrically connected with the corresponding first electrode. Each thin-film transistor provides a drive signal to each corresponding pixel region via the first electrode. For the passive organic light-emitting display panel, the pixel regions on the same row share the same first electrode; the pixel regions on the same column share the same second electrode; and the first electrode and the second electrode are insulated and crossed with each other.

It should be understood by one skilled in the art that, the above OLED device structure and the comparative data obtained by employing different optical coupling layer materials are only used for comparison to support the conclusions of the present application that are related to the refractive index of the optical coupling layer. In other implementation modes of the present application, the device structure of the OLED display panel may also be any other feasible OLED device types and stacked structures, which is not limited in the present application.

In conclusion, in the embodiments of the present invention, an optical coupling layer is provided on one side of the light exit side electrode that is far from the light-emitting functional layer, and the refractive index of the optical coupling layer in the blue light wavelength region is provided in a range of 2 to 2.3; the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1. The present invention employs an optical coupling layer that has a relatively high refractive index for blue, and has a relatively small refractive index differences between the blue, green and red band regions, so that the light extraction efficiency of each band may be improved greatly in the case that the same thickness of optical coupling layer is employed, and it does not need to set different thicknesses of the optical coupling layer for the pixel regions that emit light of different colors. Therefore, the production cost may be lowered, and the yield may be improved.

Figure 5:
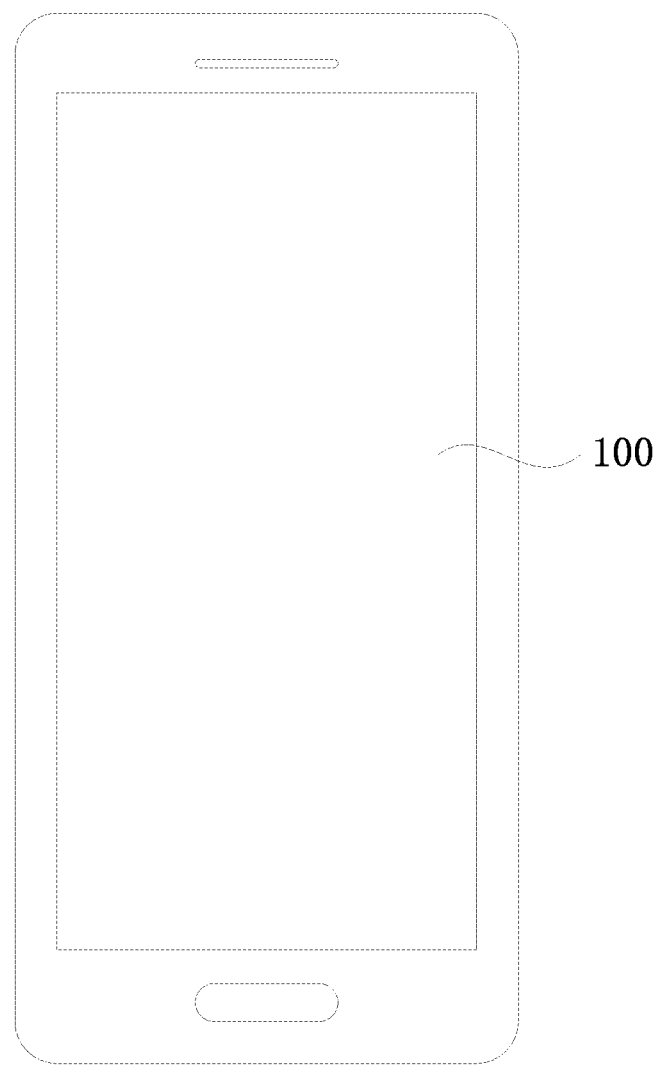
FIG. 5 is a structural representation of an electronic device according to one embodiment of the present invention.

One embodiment of the present invention further provides an electronic device. FIG. 5 is a structural representation of an electronic device according to one embodiment of the present invention. As shown in FIG. 5, the electronic device according to the embodiment of the present invention includes the organic light-emitting display panel 100 according to any embodiment of the present invention. The electronic device may be a mobile phone as shown in FIG. 5, or it may be a computer, a TV set and an intelligent wearable device, etc., which is not specifically limited in this embodiment.

Figure 6:
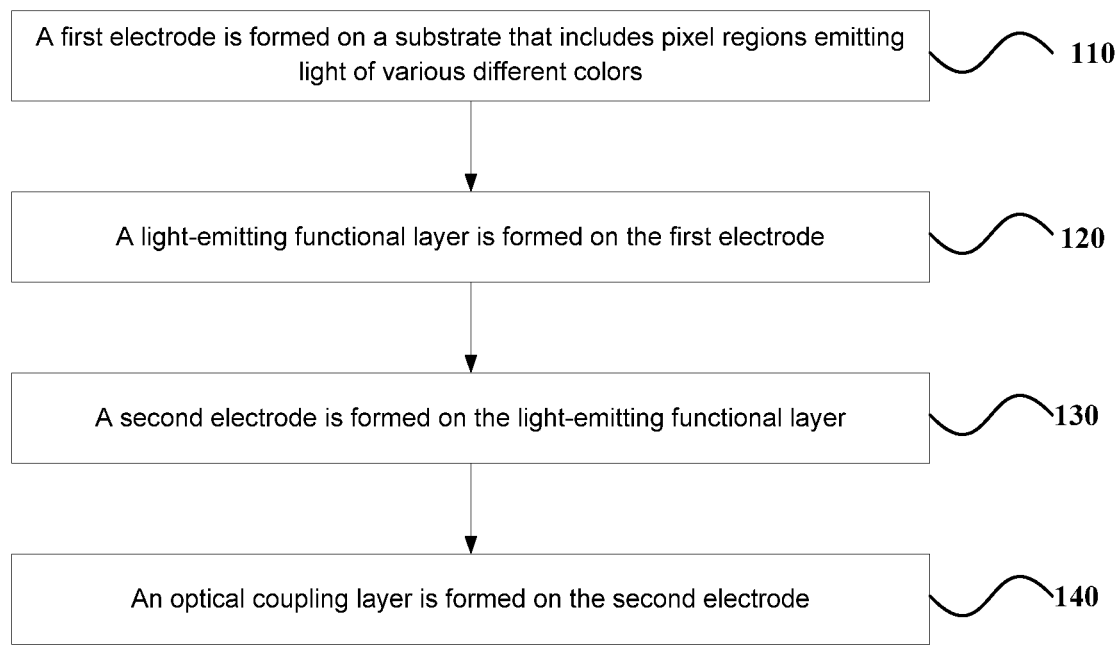
FIG. 6 is a flow chart of a method for manufacturing an organic light-emitting display panel according to one embodiment of the present invention.

Based on the same concept, one embodiment of the present invention further provides a method for manufacturing an organic light-emitting display panel. FIG. 6 is a flow chart of a method for manufacturing an organic light-emitting display panel according to one embodiment of the present invention. As shown in FIG. 6, the method includes the steps of:

Step S110: A first electrode is formed on a substrate that includes pixel regions emitting light of various different colors.

It should be noted that, optionally, after the first electrode is formed, a pixel defining layer may also be formed, wherein the pixel defining layer includes a plurality of opening structures, and each opening structure corresponds to one pixel region.

Or, before the first electrode is formed, a pixel defining layer is formed, wherein the pixel defining layer includes a plurality of opening structures, and then the first electrode is formed in each opening structure.

Step S120: A light-emitting functional layer is formed on the first electrode.

The light-emitting functional layer of the organic light-emitting display panel may include a first auxiliary functional layer, a light-emitting material layer and a second auxiliary functional layer. The first auxiliary functional layer, the light-emitting material layer and the second auxiliary functional layer of the organic light-emitting display panel may be formed via evaporation. The first auxiliary functional layer is formed of a hole-type auxiliary light-emitting material, and may have a multi-layer structure, for example, it may include a hole injection layer, a hole transport layer and an electron blocking layer. The second auxiliary functional layer is formed of an electron-type auxiliary light-emitting material, may also have a multilayer structure, and it may include an electron transport layer, an electron injection layer and a hole blocking layer.

Step S130: A second electrode is formed on the light-emitting functional layer.

The material of the second electrode is Ag or an Ag-containing metal alloy. Optionally, if the material is an Ag-containing metal alloy, the content of Ag in the second electrode will be larger than 80%. If the material of the second electrode is an Ag-containing metal alloy, the Ag-containing metal alloy may further include at least one of Mg, Yb, an alkali metal element, an alkaline earth metal element or a rare earth element. The thickness of the second electrode is in a range of about 120 Å to about 250 Å. The transmittance of the second electrode is larger than 20%.

Optionally, in the structure of the organic light-emitting display panel, the luminescent feature may be adjusted by introducing an optical micro-resonant cavity (micro-cavity structure, for short). The cavity length of the micro-cavity structure is the distance between the first electrode and the second electrode. The cavity length of the micro-cavity structure corresponding to the pixel region is positively correlated to the wavelength of the light color corresponding to the pixel region. The micro-cavity structure is formed of a multilayer film between the two electrodes of the organic light-emitting display panel, and the light can be restricted within a very small wavelength region under the effects of reflection, total reflection, interference, diffraction or scattering, etc., of light on the interfaces with discontinuous refractive indexes. By designing the cavity length and optimizing the thickness of each layer in the cavity, the luminescence center can be made in the vicinity of the antinode of the stationary field in the cavity, and the coupling efficiency of the radiating doublet of the device and the electric field in the cavity may be improved, so that the light-emitting efficiency and the lightness of the device may be improved. The cavity length of the micro-cavity structure corresponding to the pixel region is positively correlated to the wavelength of the corresponding light color. The cavity length of the micro-cavity structure may be adjusted via the first auxiliary functional layer, the light-emitting material layer and the second auxiliary functional layer.

Step S140: An optical coupling layer is formed on the second electrode.

The second electrode is a light exit side electrode of the organic light-emitting display panel, and the refractive index of the optical coupling layer in the blue light wavelength region is in a range of 2 to 2.3; the difference between the refractive index of the optical coupling layer in the blue light wavelength region and the refractive index of the optical coupling layer in the green light wavelength region is less than or equal to 0.2; the difference between the refractive index of the optical coupling layer in the green light wavelength region and the refractive index of the optical coupling layer in the red light wavelength region is less than or equal to 0.1.

Optionally, the refractive index of the optical coupling layer in the green light wavelength region is greater than or equal to 1.8, and the refractive index of the optical coupling layer in the red light wavelength region is greater than or equal to 1.7.

Optionally, in the embodiment of the present invention, the extinction coefficient of the optical coupling layer in the blue light wavelength region is less than or equal to 0.1, the extinction coefficient of the optical coupling layer in the green light wavelength region is less than or equal to 0.01, and the extinction coefficient of the optical coupling layer in the red light wavelength region is less than or equal to 0.01, so that the optical loss of the light of different colors in the optical coupling layer 50 may be further reduced, and the light extraction efficiency may be improved.

Optionally, the thickness of the optical coupling layer is in a range of 20 to 140 nm. For example, in one implementation of the present invention, the thickness of the optical coupling layer is 50 nm. After being stacked, the transmittance of the light exit side electrode and the optical coupling layer in the visible band is greater than or equal to 60%. By the fitting of the refractive indexes between the light exit side electrode, i.e., the second electrode, and the optical coupling layer, on one hand, the total reflection loss of the light on the interface of the light exit side electrode, i.e., the second electrode, may be lowered, that is, the efficiency loss caused by the optical waveguide effect may be reduced; and on the other hand, the optical coupling layer may also suppress the energy loss of the light on the surface of the light exit side electrode, i.e., the second electrode, due to surface plasmon polaritons, so that the light extraction efficiency of the organic light-emitting display panel may be improved.

Additionally, it should be understood by one skilled in the art that, in some implementation of the present invention, by the fitting of the refractive indexes between the optical coupling layer and the light exit side electrode, the light intensity reinforcement effect of the micro-cavity structure may also be strengthened, in order to improve the light extraction efficiency. Optionally, the optical coupling layer may also have a multilayer stacked structure, that is, the optical coupling layer may include at least one organic layer. The refractive index of the organic layer adjacent to the light exit side electrode is less than or equal to the refractive index of the organic layer far from the light exit side electrode. By the stacked design of the optical coupling layer and the fitting of the refractive index, the light extraction efficiency may be further improved. It should be noted that, the above optical coupling layer may be formed via evaporation, spin coating, inkjet printing or screen printing, which is not limited in the embodiments of the present invention.

Optionally, in one embodiment of the present invention, the light-emitting material layer corresponding to the pixel region that emits red light and the light-emitting material layer corresponding to the pixel region that emits green light include a phosphorescent material; and the light-emitting material layer corresponding to the pixel region that emits blue light includes a fluorescent material. The light-emitting material layer corresponding to the pixel region that emits red light and/or the light-emitting material layer corresponding to the pixel region that emits blue light are/is formed of one or two host materials; and the light-emitting material layer corresponding to the pixel region that emits green light is formed of at least two host materials. It should be noted that, the method of FIG. 6 is applicable to form a top-emission type organic light-emitting display panel, and the second electrode is a light exit side electrode of the organic light-emitting display panel.

Figure 7:
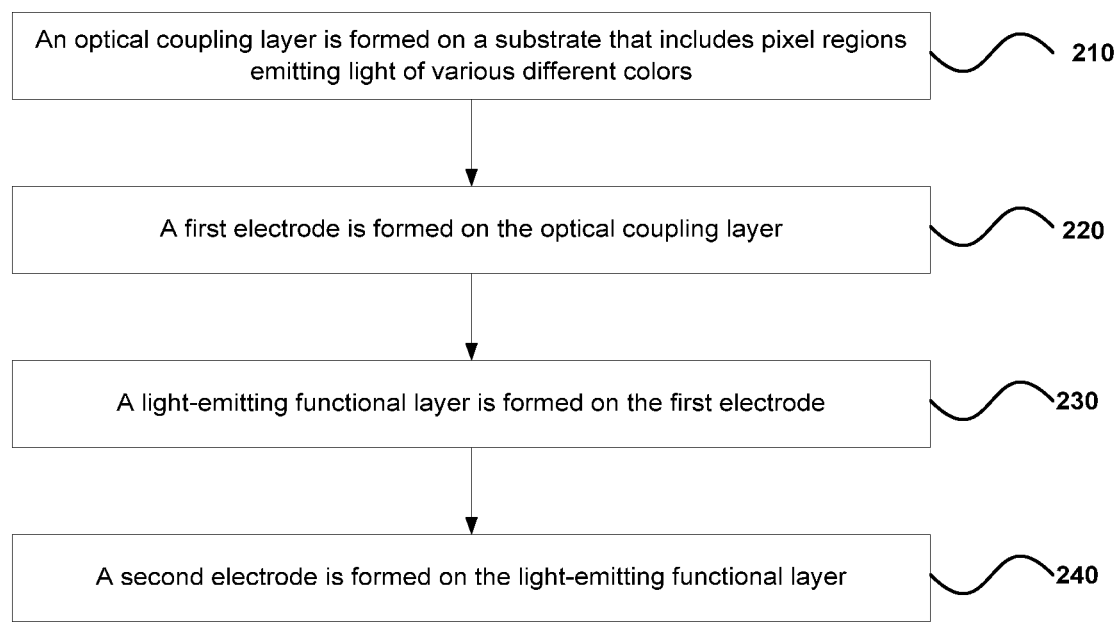
FIG. 7 is a flow chart of another method for manufacturing an organic light-emitting display panel according to one embodiment of the present invention.

The present invention further provides a method for manufacturing a bottom-emission type organic light-emitting display panel. FIG. 7 is a flow chart of another method for manufacturing an organic light-emitting display panel according to one embodiment of the present invention. As shown in FIG. 7, the method includes the steps of:

Step S210: An optical coupling layer is formed on a substrate that includes pixel regions emitting light of various different colors.

Step S220: A first electrode is formed on the optical coupling layer.

Step S230: A light-emitting functional layer is formed on the first electrode.

Step S240: A second electrode is formed on the light-emitting functional layer.

The first electrode is a light exit side electrode of the organic light-emitting display panel; the refractive index of the optical coupling layer in the blue light wavelength region is in a range of 2 to 2.3; the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1.

Figure 8:
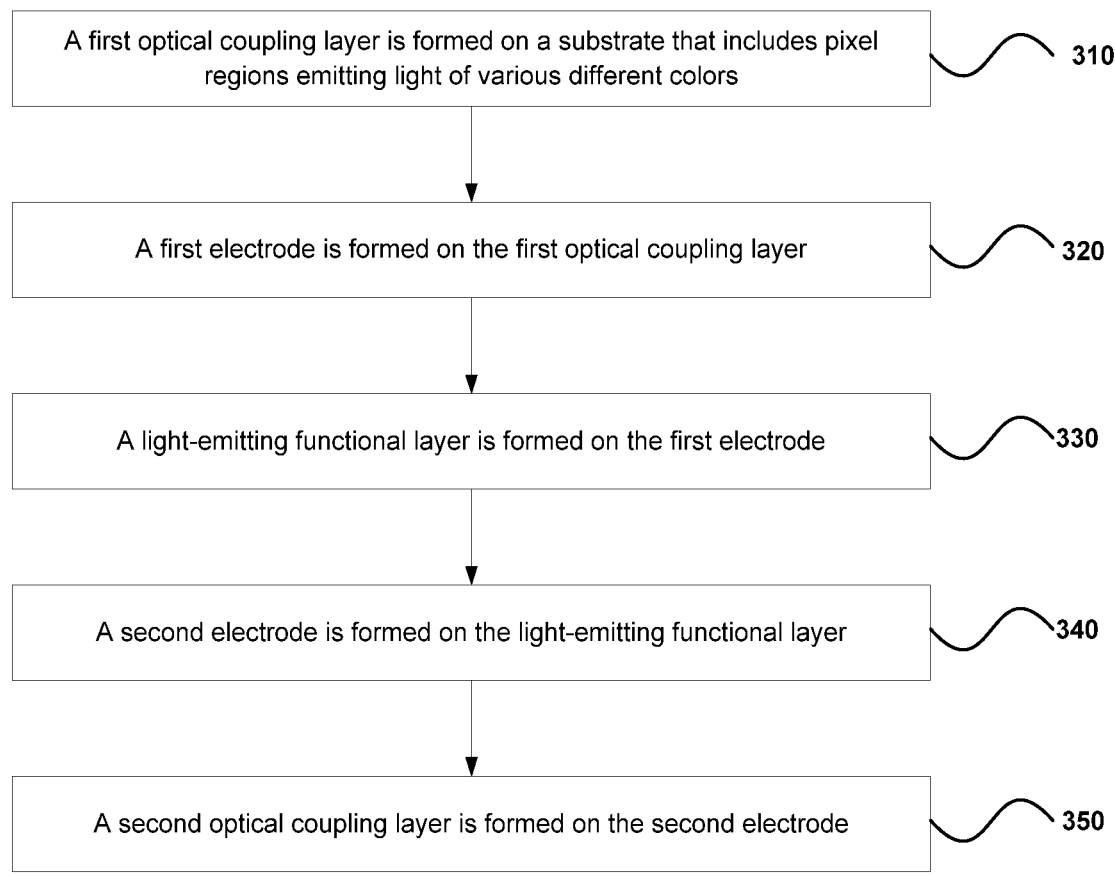
FIG. 8 is a flow chart of another method for manufacturing an organic light-emitting display panel according to one embodiment of the present invention.

The present invention further provides a method for manufacturing a dual-side emission type organic light-emitting display panel. FIG. 8 is a flow chart of another method for manufacturing an organic light-emitting display panel according to one embodiment of the present invention. As shown in FIG. 8, the method includes the steps of:

Step S310: A first optical coupling layer is formed on a substrate that includes pixel regions emitting light of various different colors.

Step S320: A first electrode is formed on the first optical coupling layer.

Step S330: A light-emitting functional layer is formed on the first electrode.

Step S340: A second electrode is formed on the light-emitting functional layer.

Step S350: A second optical coupling layer is formed on the second electrode.

The first electrode and the second electrode are both light exit side electrodes of the organic light-emitting display panel; the refractive index of the first optical coupling layer and the second optical coupling layer in the blue light wavelength region is in a range of 2 to 2.3; the difference between the refractive index of the first optical coupling layer and the second optical coupling layer in the blue light wavelength region and the refractive index of the first optical coupling layer and the second optical coupling layer in the green light wavelength region is less than 0.2; the difference between the refractive index of the first optical coupling layer and the second optical coupling layer in the green light wavelength region and the refractive index of the first optical coupling layer and the second optical coupling layer in the red light wavelength region is less than 0.1.

In conclusion, in the embodiments of the present invention, an optical coupling layer is set on one side of the light exit side electrode that is far from the light-emitting functional layer, and the refractive index of the optical coupling layer in the blue light wavelength region is set in a range of 2 to 2.3; the difference between the refractive index of the optical coupling layer in the blue light wavelength region and the refractive index of the optical coupling layer in the green light wavelength region is less than or equal to 0.2; and the difference between the refractive index of the optical coupling layer in the green light wavelength region and the refractive index of the optical coupling layer in the red light wavelength region is less than or equal to 0.1. The present invention employs an optical coupling layer that has a high refractive index and has a small refractive index difference between the blue, green and red band regions, and the light extraction efficiency of each band may be improved greatly in the case that the same thickness of optical coupling layer is employed, and it does not need to set different thicknesses of the optical coupling layer for the pixel regions that emit light of different colors, Therefore, the production cost may be lowered, and the yield may be improved.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. An organic light-emitting display panel, comprising:
   a substrate;
   a plurality of pixel regions formed on the substrate, wherein the plurality of pixel regions each comprises:
   a first electrode disposed on the substrate;
   a light-emitting functional layer disposed on the first electrode and divided into red light emitting, green light emitting, and blue light emitting portions;
   a second electrode disposed on the light-emitting functional layer, wherein the second electrode forms a light exit side electrode; and
   an optical coupling layer disposed on one side of the second electrode facing away from the substrate, wherein the optical coupling layer is directly in contact with the second electrode and configured to have a same thickness over each of the red light emitting, green light emitting, and blue light emitting portions, and the optical coupling layer consists of one layer made of an inorganic material;
   wherein a refractive index of the optical coupling layer in the blue light emitting portion is in a range of 2 to 2.3, and wherein a refractive index difference between the blue light emitting and green light emitting portions in the optical coupling layer is less than or equal to 0.2; and
   wherein a refractive index difference between the green light emitting and red light emitting portions in the optical coupling layer is less than or equal to 0.1.

2. The organic light-emitting display panel as in claim 1, wherein
   an extinction coefficient of the optical coupling layer in the blue light emitting portion is less than or equal to 0.1, an extinction coefficient in the green light emitting portion is less than or equal to 0.01, and the extinction coefficient in the red light emitting portion is less than or equal to 0.01.

3. The organic light-emitting display panel as claimed in claim 1, wherein
   a total transmissivity of the light exit side electrode and the optical coupling layer in the all red, green and blue bands is greater than or equal to 60%.

4. The organic light-emitting display panel as in claim 1, wherein
   the optical coupling layer comprises MoOx.

5. The organic light-emitting display panel according to claim 1, wherein
   the thickness of the optical coupling layer is in a range of 20 nm to 140 nm.

6. The organic light-emitting display panel as n claim 1, wherein
   a micro-cavity structure is formed between the first electrode and the second electrode, wherein a cavity length of the micro-cavity structure corresponding to the pixel region is positively correlated to the wavelength of the emitted light in the pixel region, and wherein the cavity length of the micro-cavity structure is a distance between the first electrode and the second electrode.

7. The organic light-emitting display panel as in claim 1, wherein
the light-emitting functional layer further comprises a first auxiliary functional layer, wherein the first auxiliary functional layer comprises at least one of a hole injection layer, a hole transport layer and an electron blocking layer.

8. The organic light-emitting display panel as claimed in claim 1, wherein
the light-emitting functional layer further comprises a second auxiliary functional layer, wherein the second auxiliary functional layer comprises at least one of an electron transport layer, an electron injection layer, and a hole blocking layer.

9. The organic light-emitting display panel as claimed in claim 1, wherein
the light-emitting functional layer comprises a light-emitting material layer, wherein the light-emitting material layer for the red light and the green light is composed of a phosphorescent material; and wherein the light-emitting material layer for the blue light is composed of a fluorescent material.

10. The organic light-emitting display panel as in claim 1, wherein,
the light-emitting functional layer comprises a light-emitting material layer, wherein, the light-emitting material layer comprises a plurality of host materials, wherein the plurality of host materials is at least two for green light.

11. An electronic device, having an organic light-emitting display panel of claim 1.

12. A method for manufacturing an organic light-emitting display panel, comprising:
providing a substrate;
forming a plurality of pixel units comprising:
forming a first electrode on the substrate;
forming a light-emitting functional layer on the first electrode, wherein the light-emitting functional layer is divided into red light emitting, green light emitting, and blue light emitting portions;
forming a second electrode on the light-emitting functional layer, wherein the second electrode is a light exit side electrode of the organic light-emitting display panel; and
forming an optical coupling layer on the second electrode, wherein the optical coupling layer is disposed in direct contact with one side of the second electrode facing away from the substrate;
wherein the optical coupling layer is configured to have a same thickness over each of the red light emitting, green light emitting, and blue light emitting portions;
wherein the optical coupling layer consists of one layer made of an inorganic material;
wherein a refractive index of the blue light emitting portion of the optical coupling layer is in a range of 2 to 2.3;
wherein a refractive index difference between the blue light emitting and green light emitting portions is less than or equal to 0.2 in the optical coupling layer; and
wherein a refractive index difference for the green light emitting and red light emitting portions is less than or equal to 0.1.

13. The method for manufacturing an organic light-emitting display panel as in claim 12, wherein
the optical coupling layer is formed by techniques of evaporation, spin coating, inkjet printing or screen printing.

14. The method for manufacturing an organic light-emitting display panel as in claim 12, wherein
the extinction coefficient for blue light is less than or equal to 0.1, for green and red light is less than or equal to 0.01.

15. An organic light-emitting display panel, comprising:
a substrate;
a plurality of pixel regions formed on the substrate, wherein the plurality of pixel regions each comprises:
a first electrode disposed on the substrate;
a light-emitting functional layer disposed on the first electrode and divided into red light emitting, green light emitting, and blue light emitting portions;
a second electrode disposed on the light-emitting functional layer, wherein the second electrode forms a light exit side electrode; and
an optical coupling layer disposed on one side of the second electrode, wherein the optical coupling layer has a multilayer stacked structure and is configured to have a same thickness over each of the red light emitting, green light emitting, and blue light emitting portions;
wherein a refractive index of the optical coupling layer in the blue light emitting portion region is in a range of 2 to 2.3, and wherein a refractive index difference between blue and green emitting portions in the optical coupling layer is less than or equal to 0.2; and
wherein a refractive index difference between the green and red light emitting portions in the optical coupling layer is less than or equal to 0.1.

* * * * *